United States Patent [19]

Miyashita et al.

[11] Patent Number: 5,029,554

[45] Date of Patent: Jul. 9, 1991

[54] SEMICONDUCTOR MANUFACTURING APPARATUS INCLUDING A TEMPERATURE CONTROL MECHANISM

[75] Inventors: Naoto Miyashita; Koichi Takahashi, both of Kawasaki; Hiroshi Kinoshita, Yokohama, all of Japan

[73] Assignee: Kabushiki Kaisha Toshiba, Kawasaki, Japan

[21] Appl. No.: 330,044

[22] Filed: Mar. 29, 1989

[30] Foreign Application Priority Data

Mar. 31, 1988 [JP] Japan .................. 63-76607

[51] Int. Cl.⁵ .............................................. C23C 16/00
[52] U.S. Cl. ...................................... 118/715; 118/666; 118/724; 118/725; 118/728; 427/255.2
[58] Field of Search ............... 118/715, 724, 725, 728, 118/730, 666; 156/345, 646; 427/255.2; 437/102, 225

[56] References Cited

U.S. PATENT DOCUMENTS

| | | | |
|---|---|---|---|
| 4,108,106 | 8/1978 | Dozier | 118/728 |
| 4,232,063 | 11/1980 | Rosler et al. | 118/728 |
| 4,263,872 | 4/1981 | Ban | 118/721 |
| 4,279,947 | 7/1981 | Goldman et al. | 427/255.2 |
| 4,501,766 | 2/1985 | Suzuki et al. | 427/38 |
| 4,509,456 | 4/1985 | Kleinert et al. | 118/715 |
| 4,529,474 | 7/1985 | Fujiyama et al. | 118/715 |
| 4,573,431 | 3/1986 | Sarkozy | 118/728 |
| 4,674,434 | 6/1987 | Ishihara | 118/50 |
| 4,699,805 | 10/1987 | Seelbach et al. | 118/715 |

FOREIGN PATENT DOCUMENTS

| | | | |
|---|---|---|---|
| 54-147783 | 11/1979 | Japan | 118/715 |
| 58-3633 | 1/1983 | Japan | 118/715 |
| 60-10108 | 3/1985 | Japan | . |
| 62-20875 | 1/1987 | Japan | 118/715 |
| 62-151571 | 7/1987 | Japan | 118/715 |
| 62-235471 | 10/1987 | Japan | 118/715 |
| 62-239537 | 10/1987 | Japan | 118/724 |

Primary Examiner—Shrive Beck
Assistant Examiner—Terry J. Owens
Attorney, Agent, or Firm—Finnegan, Henderson, Farabow, Garrett, and Dunner

[57] ABSTRACT

A semiconductor manufacturing apparatus includes a furnace having a tubular body with inner and outer tubular members. A boat having wafers mounted thereon is positioned inside the inner tubular member. Temperature control inside the tubular body is provided by a thermocouple device located between the inner and outer tubular members. A mixture of dichlorosilane gas and ammonium gas formed by a mixing nozzle at a temperature which is lower than the temperature in the tubular body is supplied to the wafers from positions juxtaposed with the wafers mounted on the boat.

7 Claims, 4 Drawing Sheets

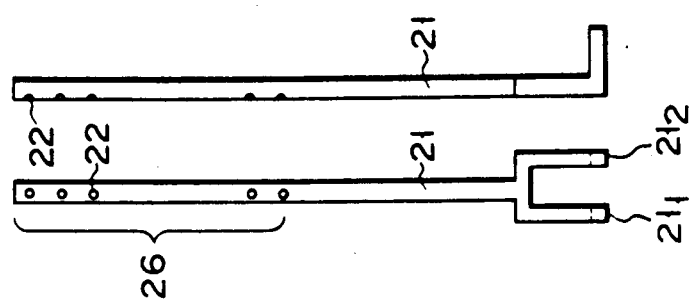
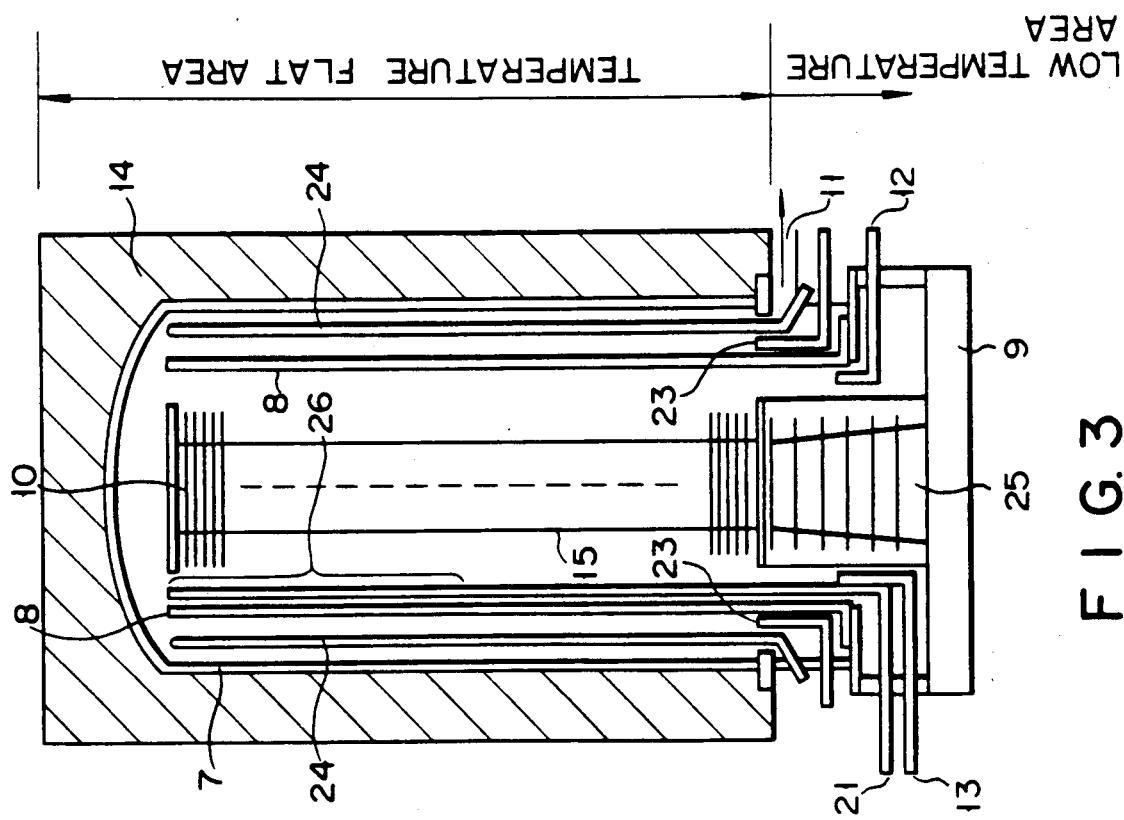

| DEPOSITION APPARATUS | VARIATION OF FILM THICKNESS ON A WAFER (%) | VARIATION OF FILM THICKNESS AMONG WAFERS (%) | VARIATION OF FILM THICKNESS AMONG BATCHES (%) |
|---|---|---|---|
| VERTICAL TYPE LP CVD OF THE INVENTION | 1.2 | 2.5 | 1.0 |
| HORIZONTAL TYPE LP CVD OF PRIOR ART | 2.5 | 3.0 | 3.0 |
F I G. 7
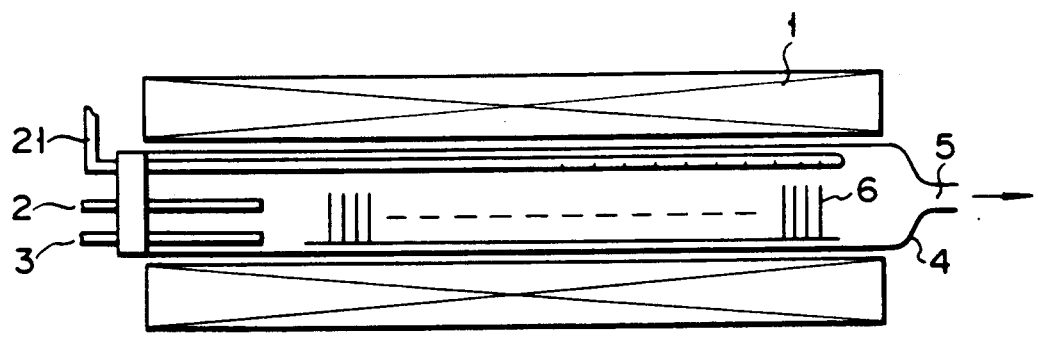
F I G. 8

SEMICONDUCTOR MANUFACTURING APPARATUS INCLUDING A TEMPERATURE CONTROL MECHANISM

BACKGROUND OF THE INVENTION

1. Field of the Invention

This invention relates to an improved semiconductor manufacturing apparatus comprising a LP-CVD (Low Pressure CVD) device.

2. Description of the Related Art

FIGS. 1 and 2 of the accompanying drawings respectively schematically illustrate a horizontal type LP-CVD device and a vertical type LP-CVD device of the prior art. In FIG. 1, the horizontal type LP-CVD device comprises a heater 1, a chlorosilane gas nozzle 2, an ammonium gas nozzle 3, a reaction tube 4, an emission port 5 and wafers 6. On the other hand, the vertical type LP-CVD device shown in FIG. 2 comprises an outer tube 7, an inner tube 8, a furnace port flange 9, wafers 10, a dichlorosilane gas nozzle 12, an ammonium gas nozzle 13 and a heater 14.

When silicon nitride films are manufactured in an apparatus as shown in FIG. 1 or 2, the inside of the reaction tube 4 or the outer tube 7 is maintained at a low pressure between 20 and 50 (Pa) and dichlorosilane gas and ammonium gas are respectively supplied through the gas nozzles 2 and 3 in FIG. 1 or the nozzles 12 and 3 in FIG. 2 so that films are formed on the wafers 6 of FIG. 1 or the wafers 10 of FIG. 2 in the furnace (having the reaction tube and the heater) which has a temperature gradient between 770° C. and 790° C. realized by the heater 1 of FIG. 1 or the heater 14 of FIG. 2. It should be noted that the furnace port $4_1$ and the pump 42 (or the emission port 5) respectively constitute the lower and higher ends of the temperature gradient in FIG. 1, while the furnace port $7_1$ and the furnace bottom $7_2$ respectively constitute the lower and the higher ends of the temperature gradient in FIG. 2.

In FIG. 1, the reaction tube 4 is surrounded by the heater 1. The dichlorosilane gas nozzle 2 and the ammonium gas nozzle 3 respectively supply dichlorosilane gas and ammonium gas so that films are formed on the wafers 6 respectively. For formation of films, the gaseous reaction product is emitted from the emission port 5. Similarly in FIG. 2, the outer tube 7 is surrounded by the heater 14. Dichlorosilane gas and ammonium gas are respectively supplied from the dichlorosilane gas nozzle 12 and the ammonium gas nozzle 13 to form films on the wafers 10. The gaseous reaction product is emitted from the emission port 11 located outside of the inner tube 8. Boat 15 is moved in or out by raising or lowering the furnace port flange 9 by an elevator.

In short, with a horizontal type LP-CVD device or a vertical type LF-CVD device of the prior art, silicon nitride films are formed in an environment where a temperature gradient is present as described above. More specifically, U.S. Pat. No. 4,279,947 issued to Goldman et al. discloses an apparatus wherein a plurality of substrates are arranged in a reaction tube and dichlorosilane gas and ammonium gas are flowed and brought to react on the substrates in a vacuum condition between approximately 300 millitorr and 20 Torr and at temperature of approximately 650° to 800° C., a temperature gradient of approximately 100° C. being realized along the gas flow.

Such a temperature gradient is required in an apparatus of the prior art to ensure an even thickness of the silicon nitride film product. If the film deposition process is conducted in a furnace where no temperature gradient is present, or under a temperature flat condition, the films produced near the furnace port will have a thickness which is greater than that of the films produced near the furnace bottom so that films with different thicknesses will be obtained as final products. In short, the temperature gradient is designed to offset the variation of thickness.

However, the provision of a temperature gradient in the furnace has certain drawbacks. First the etching speed of the silicon nitride film is inevitably dependent on the growth temperature of the film. The higher the growth temperature, and therefore the growth speed of the film, the lower the etching speed becomes.

Second the (expansion or contraction) stress of the silicon nitride film is also dependent on the growth temperature, so that the higher the growth temperatures, the smaller the stress. Therefore, films formed in a furnace having a temperature gradient have qualities which vary depending on where the wafers are arranged on the same boat.

SUMMARY OF THE INVENTION

It is therefore the object of the invention to provide a semiconductor manufacturing apparatus that can produce silicon nitride films having an identical thickness and identical qualities in the same charge lot.

The above object of the invention is achieved by providing a semiconductor manufacturing apparatus of the vertical LP-CVD type comprising furnace means having tubular body and heating means arranged around the circumference of the tube body; boat means removably accommodated in the tube body of the furnace means and provided with wafers for formation of films; temperature control means arranged in the furnace means for maintaining evenness of the temperature and providing a temperature flat area in said furnace means; mixed gas supply means for supplying a mixture of dichlorosilane gas and ammonium gas mixed in a temperature range lower than the temperature range of said temperature flat area into the tube body in the direction from the wafer located nearest to the bottom of the tubular body toward the wafer located nearest to its entrance; and gas supplying means for separately supplying dichlorosilane gas and ammonium gas from said boat means in the direction from the wafer located nearest to the inlet of the tube body toward the wafer located nearest to its bottom.

The semiconductor manufacturing apparatus according to this invention is capable of providing an even and identical temperature throughout the inside of the furnace and hence a temperature flat area there so that homogeneous films are formed on the wafers in the furnace after an etching treatment. The apparatus according to this invention is free from any trouble caused by a clogged nozzle which takes place with an LP-CVD device of the prior art where only dichlorosilane gas is supplied therethrough, since a mixture of dichlorosilane gas and ammonium gas is supplied through the nozzles of the apparatus at a temperature range lower than that of the temperature flat area to the wafers in the furnace.

BRIEF DESCRIPTION OF THE DRAWINGS

FIG. 3 is a schematic sectional view illustrating an embodiment of the semiconductor manufacturing apparatus according to the invention;

FIGS. 4A and 4B are, respectively, a plan view and a side view illustrating a mixed gas nozzle of the embodiment of FIG. 3;

FIG. 7 is a table comparing the performance device of the a horizontal type LP-CVD device of prior art in terms of the thickness of films formed in the presence of a temperature gradient and that of a vertical type LP-CVD device according to the invention in terms of the thickness of films formed in a temperature flat area; and FIG. 8 is a semiconductor manufacturing apparatus comprising a horizontal LP-CVD according to the invention.

DETAILED DESCRIPTION OF THE PREFERRED EMBODIMENT

Figure 1:
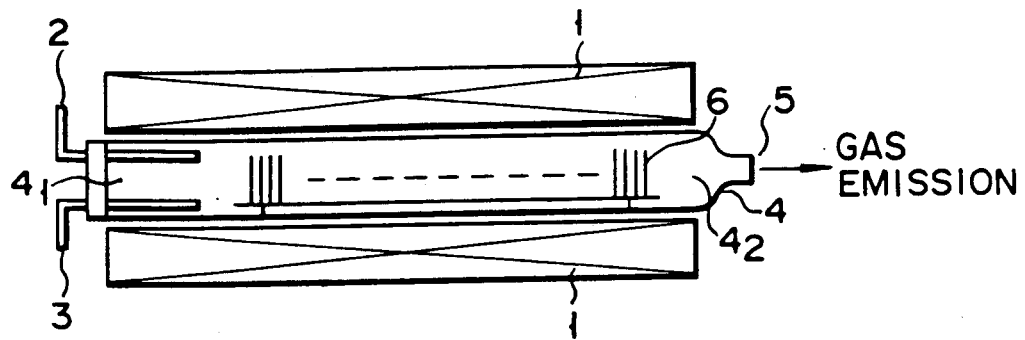
FIG. 1 is a schematic sectional view illustrating a semiconductor manufacturing, apparatus constituting a horizontal LP-CVD device of the prior art.

Now the present invention will be described in greater detail by referring to a preferred embodiment illustrated in FIGS. 3 through 8.

As shown in FIG. 3, a semiconductor manufacturing apparatus having a vertical type LP-CVD device according, to the invention comprises a furnace. The furnace includes an outer tubular member 7, an inner tubular member 8 and a heater 14 provided around the periphery of the outer tubular member 7.

A boat 15 having wafers 10 mounted thereon is accommodated in the inner tubular member 8 and supported by a furnace port flange 9 so that the boat 15 can be moved into and out of the furnace by raising and lowering the furnace port flange 9 by an elevator not shown in the drawing.

A thermocouple cover 24 is provided between said inner tubular member 8 and the outer tubular member 7 for controlling the temperature in the furnace. A heat screening plate 25 is provided between the flange 9 and the boat 15. A nozzle 12 for supplying dichlorosilane gas and a nozzle 13 for supplying ammonium gas into the furnace are arranged at the furnace port. A mixing gas nozzle 21 is provided along the longitudinal direction of the boat 15 for supplying a mixture of dichlorosilane gas and ammonium gas to the wafers located near the bottom of said inner tube 8. Reference numeral 23 in FIG. 3 denotes a gas nozzle for blowing nitrogen gas. According to the present invention, the gas mixing operation is conducted at a low temperature range and the temperature in the furnace is evenly maintained and at a constant level. Thermocouples in the thermocouple cover 24 measure the temperature in the furnace at four predetermined points and control the temperature so that a temperature flat condition is maintained in the furnace. FIG. 4A is a plan view of the mixing gas nozzle 21 and FIG. 4B is a side view thereof. Dichlorosilane gas is supplied from gas port 211 and ammonium gas is supplied from gas, port 212, which are then mixed in the mixing gas nozzle 21 so that the mixed gas is blown out of holes 22. The holes 22 are arranged within the upper half of mixing gas nozzle tube 21, which is juxtaposed with the upper flat of the boat.

It should be noted that the gas ports 211 and 212 are located near the furnace port flange 9 and operate at a low temperature within the temperature range between 30° and 180° C. for mixing with a view to prevent clogged nozzles from taking place by suppressing pyrolysis of dichlorosilane gas as the gas mixing operation is conducted at a low temperature within the range indicated above.

For the purpose of comparison, silicon nitride films were formed by using a vertical type LP-CVD device as shown in FIG. 3, where a temperature gradient was maintained in the furnace and dichlorosilane gas and ammonium gas were respectively supplied from the dichlorosilane gas nozzle 12, the ammonium gas nozzle 13 and the mixing gas nozzle 21 simultaneously for reaction.

Figure 2:
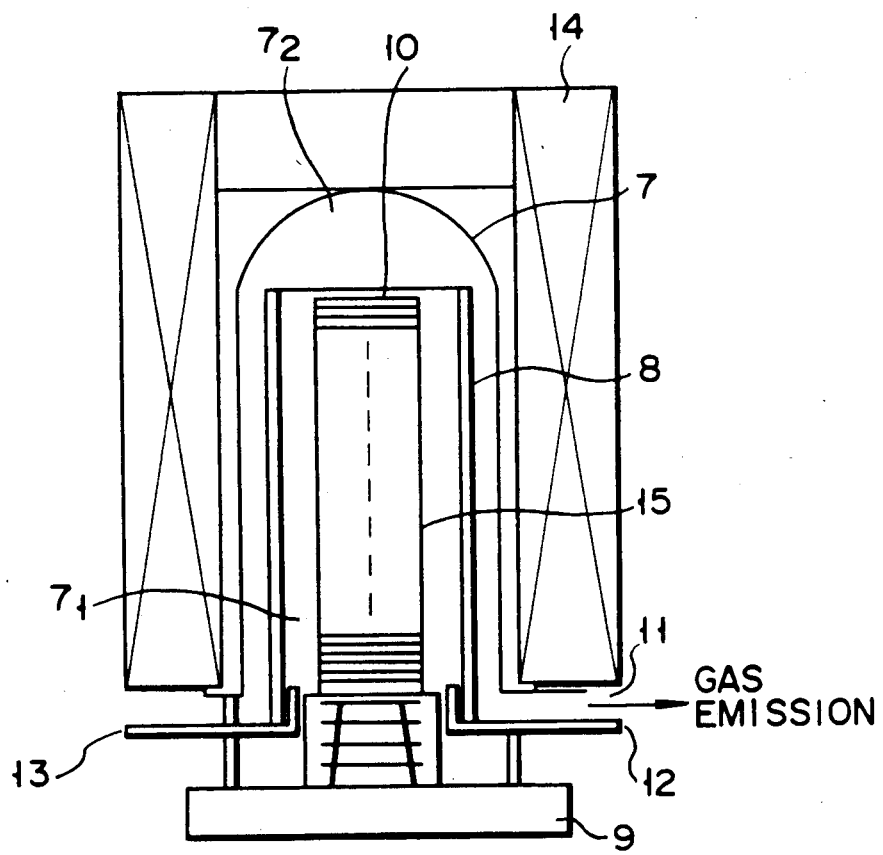
FIG. 2 is a schematic sectional view illustrating a semiconductor manufacturing apparatus comprising a vertical LP-CVD device of the prior art.
Figure 5:
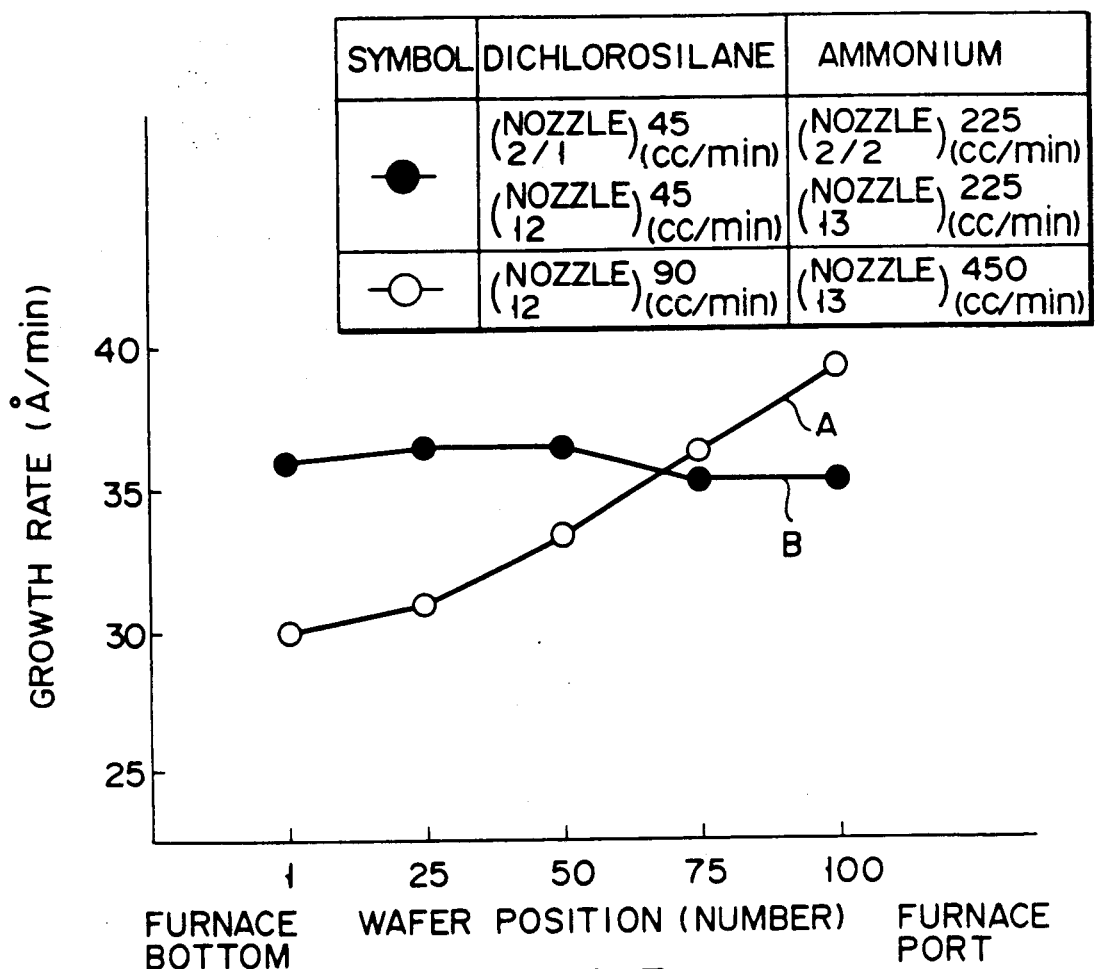
FIG. 5 is a graphic illustration showing the relationship between the film thickness and the position of the wafers in the furnace of the present invention and that of the prior art for comparison to evidence the evenness of the thickness of the films produced by the present invention.
Figure 6:
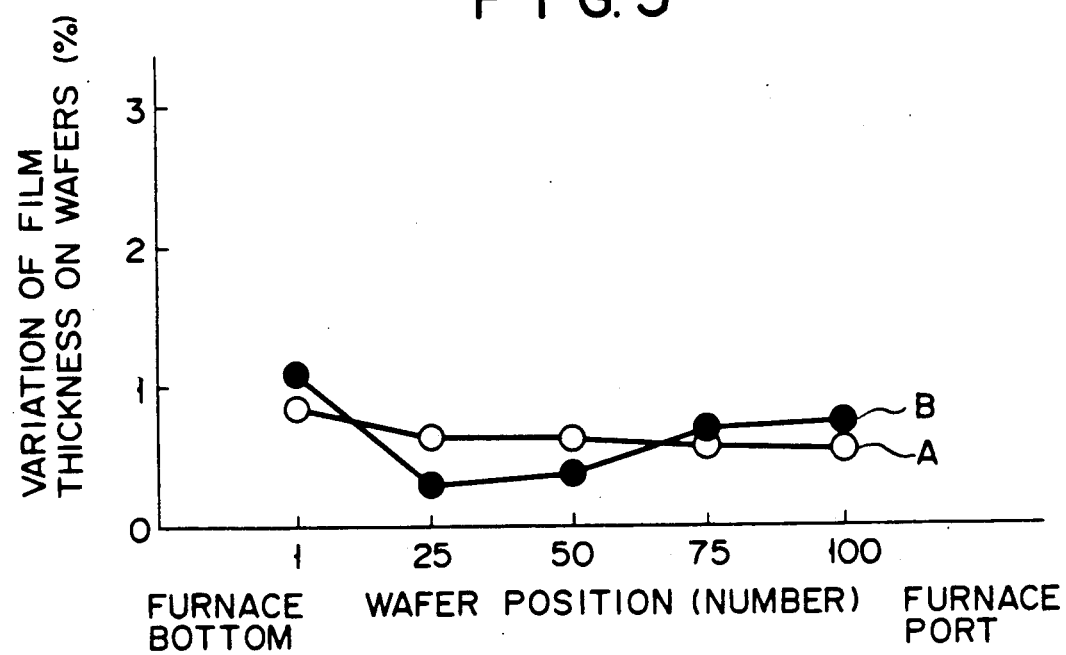
FIG. 6 is a graphic illustration showing the relationship between the variation of thickness and the position of the wafers in the furnace of the present invention and that of the prior art.

FIGS. 5 and 6 show the degree of evenness of the films formed by a vertical type LP-CVD device of the prior art (FIG. 2) and that of the films produced by a vertical type LP-CVD device according to the invention (FIG. 3). In these graphic illustrations, dotted line A represents the films formed by a vertical type LP-CVD device of the prior art having no temperature gradient and dotted line B represents the films formed by a vertical type LP-CVD device of the present invention having no temperature gradient. It is obvious from these graphic illustrations that silicon nitride films having a nearly identical thickness are formed by an apparatus comprising a vertical LP-CVD device according to the invention.

FIG. 7 is a table showing the degree of evenness of thickness of the silicon, nitride film produced by a horizontal type LP-CVD device of the prior art (FIG. 1) and those produced by a vertical type LP-CVD device of the invention. From the table of FIG. 7, it is obvious that a vertical type LP-CVD device of the invention can produce silicon nitride films having a thickness which is almost identical to the horizontal type LP-CVD device of the prior art having a temperature gradient. It should be noted that FIG. 7 shows dispersions of thickness of the films prepared by an apparatus charged with 100 five-inch wafers. The conditions of film depositon for a vertical type LP-CVD device of the invention are as follows: growth temperature: 780° C. flat, growth pressure: 0.15 Torr, dichlorosilane gas flow rate: 90 cc/min, ammonium gas flow rate: 450 cc/min. The conditions for a horizontal type LP-CVD of the prior art are as follows: growth temperature: 770°-780°-790° C., growth pressure: 0.35 Torr, dichlorosilane gas flow rate: 37 cc/min, ammonium gas flow rate 160 cc/min.

FIG. 8 shows another embodiment of the present invention comprising a horizontal type LP-CVD device. As in the case of the above embodiment, this embodiment differs from a horizontal type LP-CVD device of the prior art (FIG. 1) in that it comprises a mixing gas nozzle 21 and reactions are conducted under a temperature flat condition in the furnace. The rest of the reaction conditions as well as the effects of this embodiment are similar to those of the above described embodiment.

It will be obvious that various alterations and modifications can be made to the above embodiments within the scope of the present invention. For example, while dichlorosilane gas and ammonium gas are introduced separately into the furnace in the above embodiments, they can be introduced after having been mixed with each other. It should also be noted that the ratio of the flow rate of dichlorosilane gas and that of ammonium gas is advantageously found between 1:5 and 1:15.

What is claimed is:

1. A semiconductor manufacturing apparatus comprising:
   furnace means including heating means and a tubular body comprising an inner tubular member and an outer tubular member, the tubular body having an inlet region at a first end of the tubular body, and a furnace port flange connected to the tubular body at a second end of the tubular body, and the heating means being provided around the periphery of the outer tubular member;
   boat means removably inserted in the tubular body;
   a plurality of wafers provided on the boat means each having a thin film formed thereon;
   temperature control means provided in the tubular body between the inner tubular member and the outer tubular member for controlling the temperature therein, to maintain the circumference of the boat means at a uniform temperature;
   mixed gas supply means provided in the furnace means for supplying a mixture of dichlorosilane gas and ammonium gas, mixed at a temperature lower than the uniform temperature in the tubular body, into the tubular body adjacent wafers disposed nearest the inlet region of the tubular body; and
   gas supply means for separately supplying dichlorosilane gas and ammonium gas into the tubular body adjacent wafers disposed nearest the furnace port flange.

2. A semiconductor manufacturing apparatus according to claim 1, wherein the ratio of the flow rate of dichlorosilane gas and that of ammonium gas for producing mixed gas is between 1:5 and 1:15.

3. The semiconductor manufacturing apparatus according to claim 1, wherein the temperature for mixing dichlorosilane and ammonium gas is about 30° to about 180° C.

4. A semiconductor manufacturing apparatus comprising:
   furnace means including heating means and a tubular body having an inner tubular member and an outer tubular member, the tubular body having a furnace port flange connected to one end of the tubular body, and the heating means being provided around the outer periphery of the outer tubular member;
   boat means removably inserted in the tubular body;
   a plurality of wafers provided on the boat means each having a thin film formed thereon;
   temperature control means provided in the tubular body between the inner tubular member and the outer tubular member for controlling the temperature therein to maintain at least a portion of the tubular body at a uniform temperature;
   mixed gas supply means provided in the furnace means for supplying a mixture of dichlorosilane gas and ammonium gas, mixed at a temperature lower than the uniform temperature in the tubular body, into the tubular body adjacent wafers disposed nearest the inlet region of the tubular body.

5. A semiconductor manufacturing means according to claim 4 wherein the ratio of the flow rate of dichlorosilane gas and that of ammonium gas for producing mixed gas is between 1:5 and 1:15.

6. The semiconductor manufacturing apparatus according to claim 4, wherein the temperature for mixing the dichlorosilane gas and the ammonium gas is between about 30° and about 180° C.

7. The semiconductor manufacturing apparatus of claim 4, further comprising gas supply means for separately supplying dichlorosilane gas and ammonium gas into the tubular body adjacent wafers disposed nearest the furnace port flange.

* * * * *